United States Patent [19]

Marui et al.

[11] Patent Number: 5,078,474

[45] Date of Patent: Jan. 7, 1992

[54] EXPOSURE APPARATUS HAVING A MAGNIFYING LENS SYSTEM

[75] Inventors: Masatoshi Marui, Saitama; Tomonori Inage, Tokyo; Yuji Matsui, Kawagoe; Tazuko Ishizuka, Urawa, all of Japan

[73] Assignee: Asaki Kogaku Kogyo Kabushiki Kaisha, Tokyo, Japan

[21] Appl. No.: 616,657

[22] Filed: Nov. 21, 1990

Related U.S. Application Data

[62] Division of Ser. No. 249,764, Sep. 26, 1988, Pat. No. 5,026,145.

[30] Foreign Application Priority Data

Sep. 24, 1987 [JP] Japan ................................ 62-239832
Jun. 14, 1988 [JP] Japan ................................ 63-146134

[51] Int. Cl.$^5$ ................................................ G02F 1/13
[52] U.S. Cl. ................................ 359/40; 359/43; 359/663
[58] Field of Search ............... 350/331 R, 334, 338, 350/351, 415; 353/122

[56] References Cited

U.S. PATENT DOCUMENTS

| | | | |
|---|---|---|---|
| 3,565,511 | 2/1971 | Dilworth | 350/415 |
| 3,773,404 | 11/1973 | Moore | 350/334 |
| 3,995,954 | 12/1976 | Dir et al. | 350/331 R |
| 3,999,838 | 12/1976 | Sprokel | 350/351 X |
| 4,031,529 | 6/1977 | Borel et al. | 350/334 |
| 4,040,047 | 8/1977 | Hareng et al. | 350/351 |
| 4,099,857 | 7/1978 | Hareng et al. | 350/351 |
| 4,150,396 | 4/1979 | Hareng et al. | 350/351 X |
| 4,288,822 | 9/1981 | Hareng et al. | 350/351 |
| 4,334,735 | 6/1982 | Hareng et al. | 350/351 |
| 4,441,792 | 4/1984 | Tateoka | 350/415 |
| 4,561,727 | 12/1985 | Heeks et al. | 350/351 X |
| 4,606,613 | 8/1986 | Urabe | 350/351 |
| 4,639,722 | 1/1987 | Urabe et al. | 350/351 X |
| 4,653,867 | 3/1987 | Urable et al. | 350/331 R |
| 4,792,213 | 12/1988 | Hilsum | 350/334 |

FOREIGN PATENT DOCUMENTS

| | | | |
|---|---|---|---|
| 0195211 | 11/1984 | Japan | 350/415 |
| 62-206528 | 9/1987 | Japan. | |
| 62-52290 | 11/1987 | Japan. | |
| 0081414 | 4/1988 | Japan | 350/415 |

OTHER PUBLICATIONS

Bartolino et al., Ultrasonic Modulation of Light With A Liquid Crystal in Symetic-A and Nematic Phases, Journal of Applied Physics, vol. 5, No. May 1975.
Laser-Addressed Liquid Crystal Displays, Optical Engineering, vol. 23, No. 3, May-Jun. 1984, pp. 230-240.
A Compact High Resolution Projection Utilizing A Laser Diode Addressed Liquid Crystal Light Valve, SPIE vol. 760, Large Screen Displays, 1987 pp. 62-69.
Performance of Laser-Addressed Liquid Crystal Map Overlay Display, SPIE, vol. 760, Large Screen Displays, 1987, pp. 70-73.

*Primary Examiner*—Stanley D. Miller
*Assistant Examiner*—Huy K. Mai
*Attorney, Agent, or Firm*—Sandler, Greenblum & Bernstein

[57] ABSTRACT

An exposure apparatus for use in fabricating a printed circuit board. A thermally-written liquid-crystal light valve is provided in which a pattern is formed by opaque portions and transparent portions. A writing optical system directs a heating spot light onto the light valve. The light valve and/or the heating spot light is movable, relative to the other. A projecting optical system is arranged which transmits a luminous flux emitted from a light source, through a liquid-crystal layer within the liquid-crystal light valve. The projecting optical system illuminates a subject with the transmitted luminous flux.

27 Claims, 11 Drawing Sheets

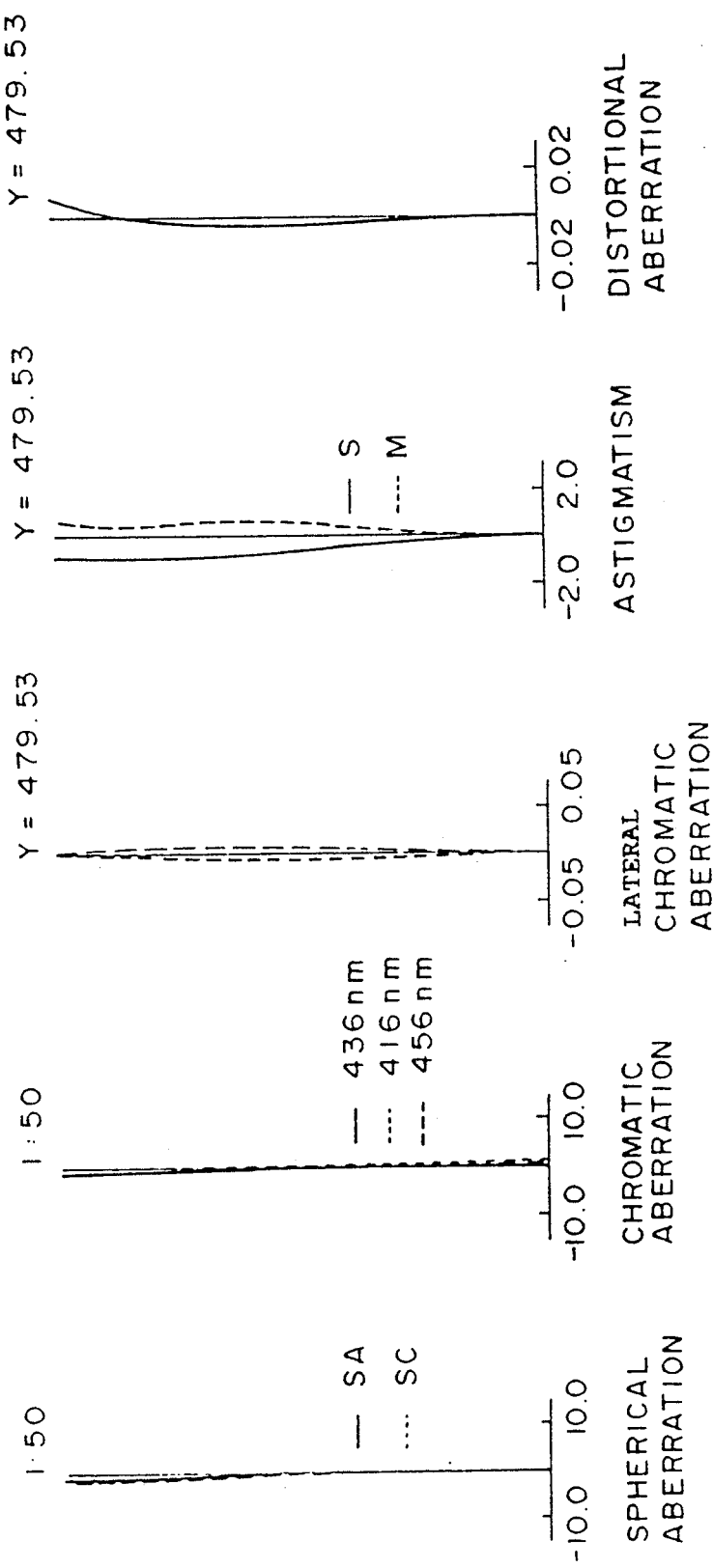

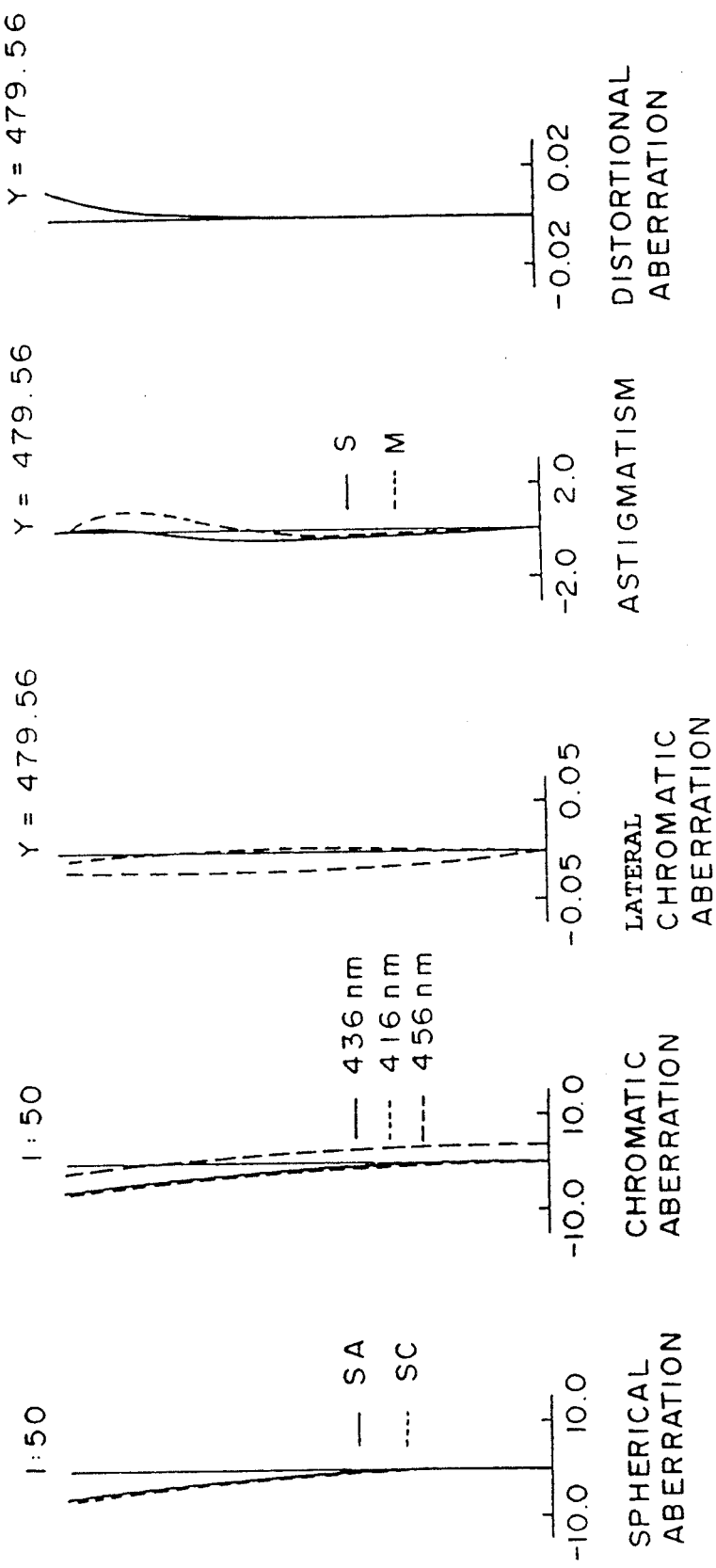

F I G. 14
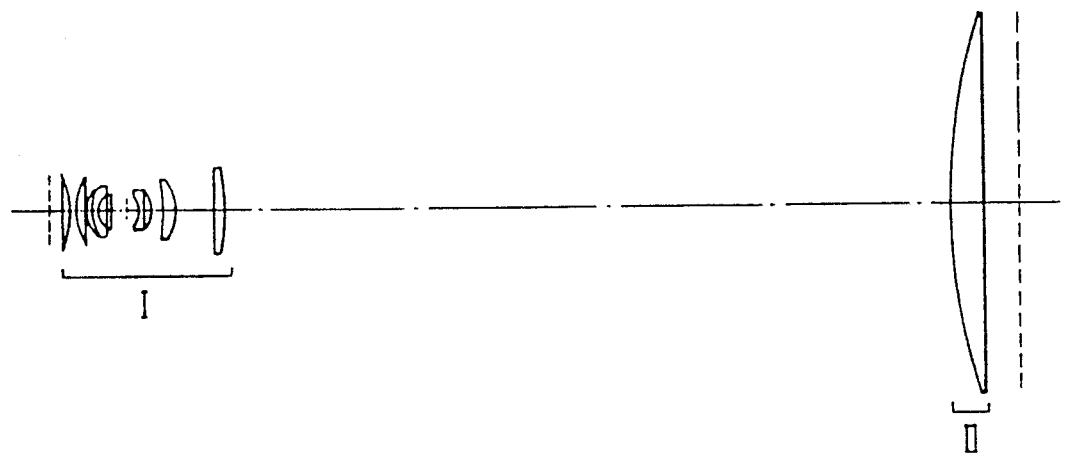
F I G. 15
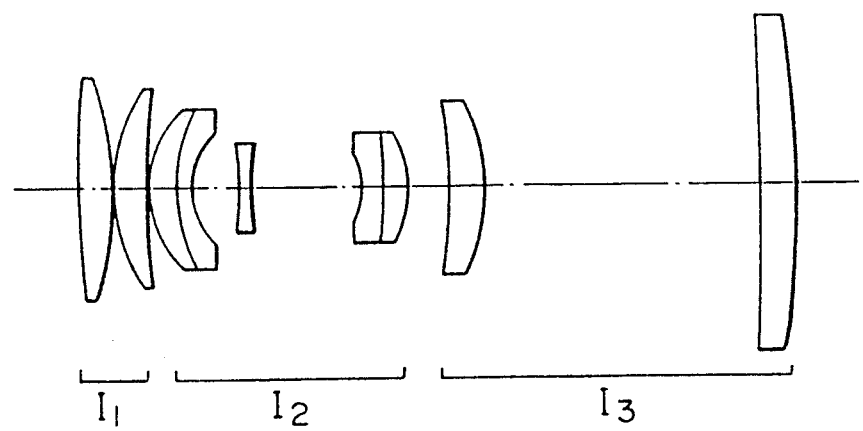

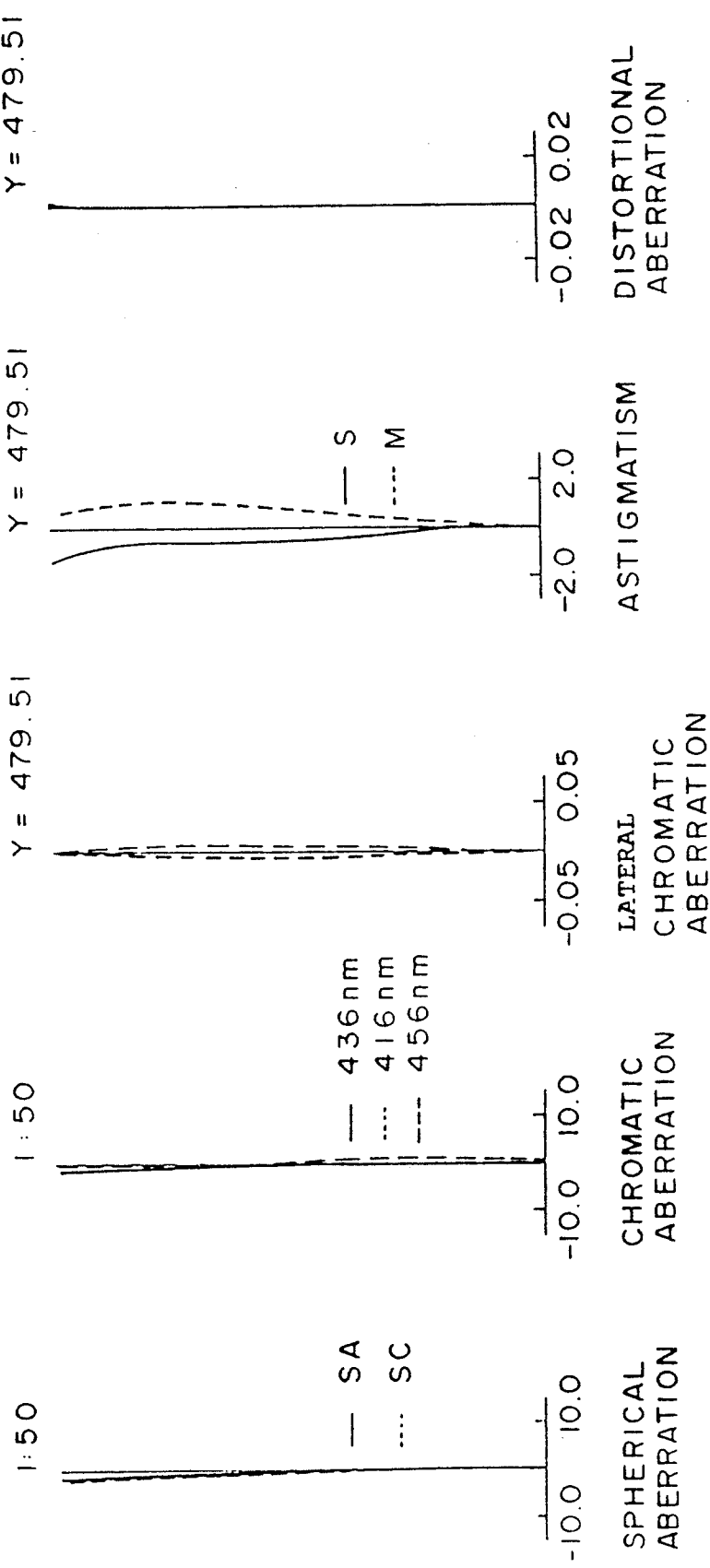

EXPOSURE APPARATUS HAVING A MAGNIFYING LENS SYSTEM

This is a division of application Ser. No. 07/249,764 filed Sept. 26, 1988, now U.S. Pat. No. 5,026,145.

BACKGROUND OF THE INVENTION

This invention relates to an exposure apparatus for use in fabricating of printed circuit boards and so on.

A method for forming a predetermined electric circuit pattern onto a substrate for a printed circuit board is known, in which masking is applied to requisite portions of a copper layer on the substrate, unrequisite portions are removed by means of etching and, then, the masking layer is removed.

The masking has conventionally been carried out in the following manner: a mask film having recorded thereon a predetermined pattern is brought into close contact with a photosensitive layer, such as a photoresist provided on the substrate for the printed circuit board. The photosensitive layer is then exposed to intensive ultraviolet rays. Subsequently, the exposed photosensitive layer is developed. According to this masking meth.do, the development makes it possible to form the mask layer in conformity with the pattern on the mask film.

FIGS. 1 and 2 are views for, explaining the exposure processings according to the above-described conventional exposure method.

In the figures, reference numeral 1 denotes a substrate for a printed circuit board. The substrate 1 is provided on both sides thereof with respective photosensitive layers. Reference numerals 2 and 3 denote, respectively, upper and lower mask films. Negative or positive films are employed as the mask films 2 and 3, depending upon the properties of the photosensitive material.

After positioning the substrate 1 and the upper and lower mask films 2 and 3, an encaustic frame 5, having stretched thereon a Mylar film 4, is downwardly moved, as viewed in FIG. 1. The encaustic frame 5 is elastically urged against a rubber sealing member 7 mounted on an encaustic glass frame 6, so that the substrate 1 is isolated from the environmental air. A space between the Mylar film 4 and the encaustic glass frame 6 is then vacuum-evacuated to bring the substrate 1 and the upper and lower mask films 2 and 3 into close contact with each other, as shown in FIG. 2.

Subsequently, the ultraviolet rays are irradiated as indicated by the arrows in FIG. 2, to expose the photosensitive layers to the ultraviolet rays, thereby photosensitizing the photosensitive layers in accordance with the patterns on the respective upper and lower mask films 2 and 3.

However, several problems exist when the above-described conventional exposure method using the mask films are used.

First, once the mask films 2 and 3 and the substrate 1 have been positioned, it is no longer possible to move the mask films 2 and 3 and the substrate 1 relative to each other, because they are in close contact with each other. Accordingly, the positioning can only be carried out under such a condition that the mask films 2 and 3 and the substrate 1 slightly float relative to each other. By this reason, it is difficult to insure the identity between the initially set relative positional relationship among the mask films 2 and 3 and the substrate 1 and the relative positional relationship at the time they are brought under vacuum into close contact with each other. This is not preferable in view of the desired accuracy.

Secondly, direct contact between the mask films 2 and 3 and the substrate 1 sometimes causes flaws on the mask films 2 and 3, resulting in a reduction of the pattern accuracy.

Thirdly, since the mask films 2 and 3 are brought into close contact with the substrate 1, a time is necessary for the vacuum evacuation in addition to the period of time for the exposure which is the primary object. This hinders an improvement in the throughput, i.e., the processing efficiency.

Moreover, it is necessary to replace the mask films 2 and 3 with another one each time the circuit pattern to be.formed on the substrate 1 changes. Thus, the cost of manufacture increases, particularly in the case of a multi-kind small-quantity production.

SUMMARY OF THE INVENTION

It is therefore an object of the present invention to provide an improved exposure apparatus that is capable of photosensitizing a photosensitive layer in accordance with a circuit pattern, without the use of mask films.

For the above purpose, according to the invention, there is provided an exposure apparatus for exposing a subject with an optical image,which comprises:

a thermally-written liquid-crystal light valve having accommodated therein a liquid crystal layer;

writing optical means for emitting a heating spot light directed onto the liquid-crystal light valve, at least one of the liquid-crystal light valve and the heating spot light being relatively displaceable to the other to cause the heating spot light to write a predetermined pattern into the liquid-crystal light valve; and a projecting optical system including a light source, first optical means arranged between the light source and the liquid-crystal light valve transmitting a first luminous flux emitted from the light source, through the liquid crystal layer formed into the predetermined pattern, and second optical means arranged between the liquid-crystal light valve and the subject for bringing the luminous flux transmitted through the liquid crystal layer, to a substantially telecentric second luminous flux and for illuminating the subject with the second luminous flux, whereby the subject is exposed with the optical image corresponding to the predetermined pattern into which the liquid crystal layer is formed.

DESCRIPTION OF THE ACCOMPANYING DRAWINGS

FIGS. 10a through 10e is a graphical representation of various aberrations of the lenses illustrated in FIG. 8;

FIGS. 13a through 13e is a graphical representation of various aberrations of the lenses illustrated in FIG. 11;

FIG. 14 is a view similar to FIG. 8, but showing a third exemplification of the magnifying lens system;

FIG. 15 is an enlarged side elevational view of a plurality of groups of small-diameter lenses illustrated in FIG. 14; and FIGS. 16a through 16e is a graphical representation of various aberrations of the lenses illustrated in FIG. 14.

DESCRIPTION OF THE EMBODIMENTS

Figure 1:
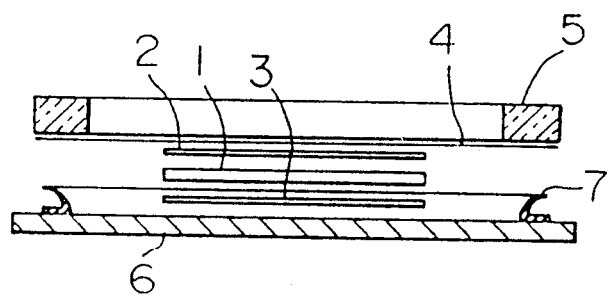
FIGS. 1 and 2 are schematic views for explanation of exposure processings in the conventional method.
Figure 2:
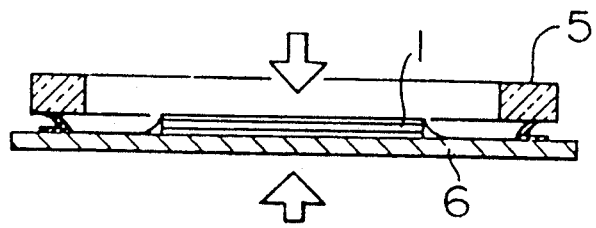
Figure 3A:
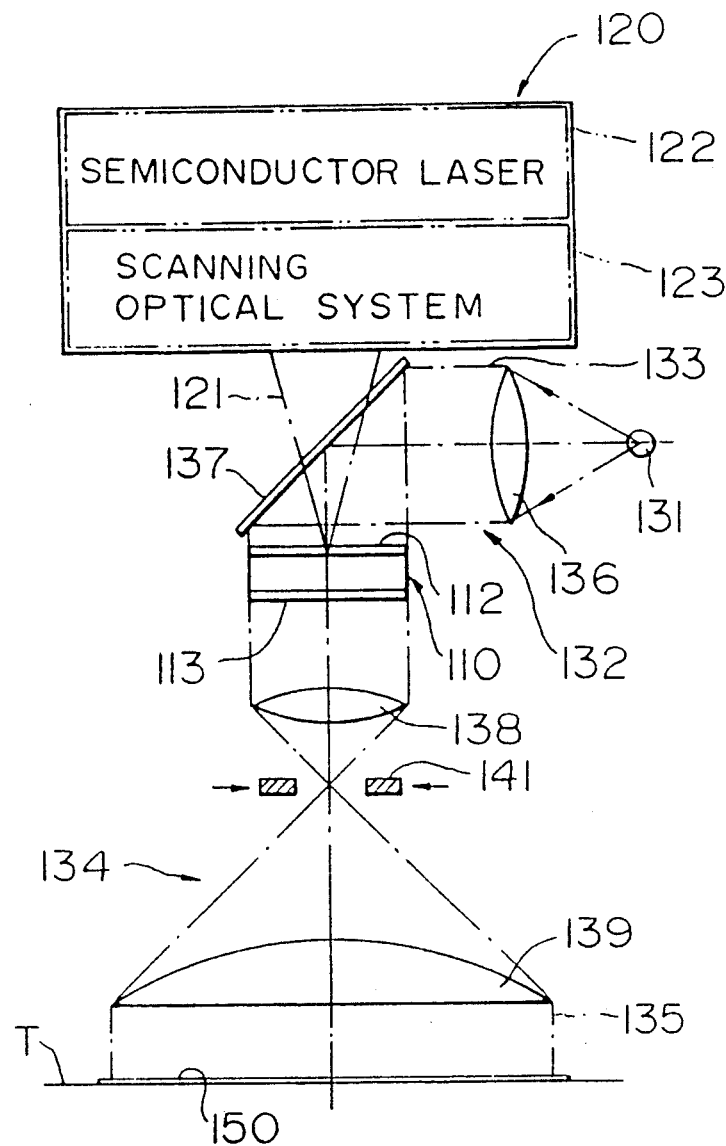
FIG. 3A is a schematic view of an exposure apparatus embodying the invention.
Figure 4:
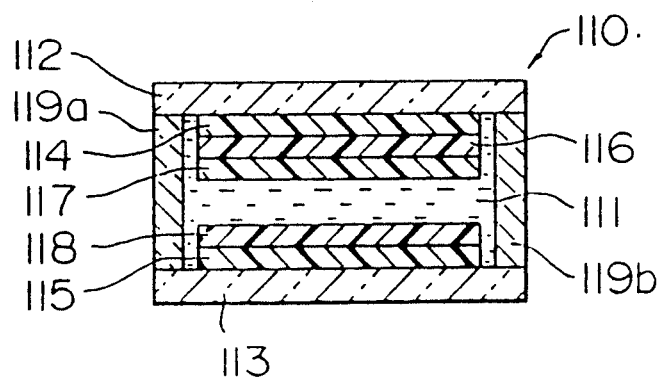
FIG. 4 is an enlarged cross-sectional view of a liquid-crystal light valve employed in the exposure apparatus illustrated in FIG. 3A.

Referring to FIGS. 3A and 4, there is shown an exposure apparatus for use in the fabrication of printed circuit boards, embodying the prsent invention. The apparatus shown here is of the so called transmission type, in which a projected light is transmitted through a liquid crystal layer, to be described below.

The exposure apparatus generally comprises a thermally written liquid-crystal light valve 110 in which a pattern composed of opaque portions and transparent portions of a liquid crystal layer 111 is formed by means of a thermal writing from the outside, to be described below. A writing optical system 120 is adapted to direct a heating spot light 121 onto the liquid-crystal light valve 110. The heating spot light 121 is movable relative to the liquid-crystal light valve 110. A projecting optical system includes a light source 131, a first optical unit 132 arranged between the light source 131 and the liquid-crystal light valve 110 for bringing a luminous flux emitted from the light source 131 to a first luminous flux 133 and for transmitting the same through the liquid crystal layer 111 formed into the predetermined pattern. The projecting optical system further includes a second optical unit, such as a magnifying lens system 134, arranged between the liquid-crystal light valve 110 and a substrate 150 for the printed circuit board placed on a table T, for bringing a luminous flux transmitted through the liquid crystal layer 111 formed into the predetermined pattern to a substantially telecentric second luminous flux 135 and for illuminating the substrate 150 with the second luminous a flux 135 to form a pattern on the substrate 150 corresponding to the predetermined pattern into which the liquid crystal layer 111 is formed.

As shown in FIG. 4, the liquid-crystal light valve 110 comprises a pair of front and rear transparent flat glass substrates 112 and 113 arranged in spaced relation to each other. One of opposite sides of the front substrate 112 is arranged to face toward the writing optical system 120. One of opposite sides of the rear substrate 113 is arranged to face toward the substrate 150 for the printed circuit board. The other sides of the respective front and rear substrates 112 and 113 face toward each other. A first transparent electrode 114 is formed on the other side of the front substrate 112 and, likewise, a second transparent electrode 115 is formed on the other side of the rear substrate 113. A light absgrption layer 116 is formed on the first transparent electrode 114 so as to cover the same. The light absorption layer 116 has its maximum absorption with respect to the wavelengths of a semiconductor laser 122 of the writing optical system 120, to be subsequently described. A first alignment layer 117 is formed on the light absorption layer 116 so as to cover the same and, likewise, a second alignment layer 118 is formed on the second transparent electrode 115 so as to cover the same. Spacers 119a and 119b are arranged between the front and rear substrates 112 and 113 in such a manner that a predetermined gap is defined between the first and second alignment layers 117 and 118. A liquid crystal is filled in the predetermined gap to form the aforementioned liquid crystal layer 111.

The writing optical system 120 includes the semiconductor laser 122, having a peak light-emission wavelength of 830 nm, and a moving system and/or a scanning optical system 123. The scanning optical system 123 is designed to converge a luminous flux from the semiconductor laser 122 so as to form a heating spot light 121 having a diameter of 10 μm onto the front substrate 112 of the liquid-crystal light valve 110. The scanning optical system 123 causes the heating spot light 121 to scan one side of the front substrate 112 in a two-dimensional manner.

The scanning optical system 123 has incorporated therein a combination of two galvano-mirrors for the X and Y directions and an arc-sine lens, a combination of a polygonal mirror and an Fθ lens, or any other combination. In the case of the combination of the polygonal mirror and the Fθ lens, a moving mechanism is additionally required for moving one of the writing optical system 120 and the liquid-crystal light valve 110 in the second direction.

Figure 3B:
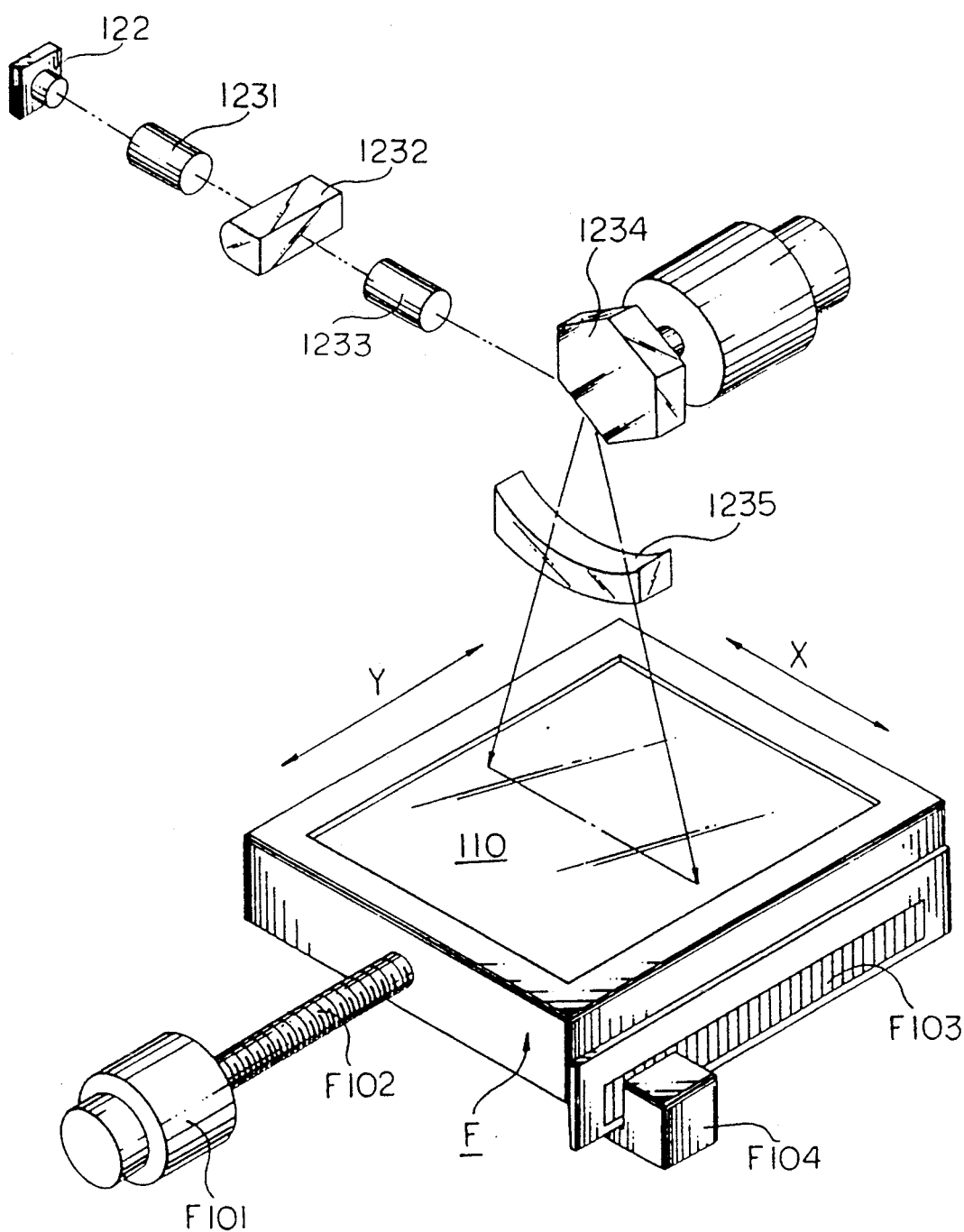
FIG. 3B is a schematic view showing an example of a writing optical system and a frame carrying a liquid-crystal light valve.

FIG. 3B illustrates one example of the writing ootical system 120 and the liquid-crystal light valve 110. In this example, the laser beam carrying the writing information emitted from the semiconductor laser 122 is directed to a polygonal mirror 1234 through a collimater lens 1231, a beam shaper 1232 and a beam expander 1233. Then, the beam is deflected in the X direction by the polygonal mirror 1234 and directed to the liquid-crystal light valve 110 through a dichroic mirror 137 (not illustrated in FIG. 3B).

The liquid-crystal light valve 10 is carried by a square frame F, which is reciprocatively movable in the Y direction by a driving motor F101 coupled to the frame F through a screw shaft F102. A position indicator F103 is secured to one side of the frame F, and a sensor F104, which is secured to a body frame (not shown), reads the indicator F103.

Although in the example of FIG. 3B, the liquid-crystal light valve 110 is designed to be movable in the Y direction, the writing optical system 120 may instead be arranged to be movable in the Y direction.

Alternately, by arranging the frame F to be movable in both the X and Y directions, the writing optical system 20 may be arranged such that the heating spot light 121 is projected onto a certain fixed position.

The writing by the writing optical system 120 is controlled in such a manner that, in each of the first and second scanning directions, a pitch between a center of one of each pair of adjacent heating spot lights 121 and a center of the other heating spot light 121 becomes 12.5 μm, in other words, in such a manner that each pair of adjacent heating spot lights 121 are partially overlapped with each other.

The above control manner will be compared with such a control manner that the pitch between each pair of adjacent heating spot lights is equal to the diameter of each heating spot light. When a line is drawn in the first scanning direction, it is possible for both the control manners to draw a clear line if the heating spot light is caused to scan while emitted continuously. When, however, a line in the second direction, an inclined line or the like is drawn, the coincidence of the pitch with the diameter of the heating spot light causes the edge of the line to be brought to a corrugated shape. This is inadequate to the use of formation of a conductor pattern onto the substrate 150 for the printed ci.rcuit board. By contrast, if the pitch is set to a value on the order of a fourth of the diameter of the heating spot light, as described above, the corrugation along the edge of the drawn line can be considerably improved, even when the line in the second direction, the inclined line or the like is drawn, making it possible to bring the drawn line close to a straight line.

The projecting optical system, which is composed of the optical unit 132 and the magnifying lens system 134, will now be described in detail. The first optical unit 132 includes a collimating lens 136 for bringing the luminous flux emitted from the projecting light source 131 and converged by a reflecting mirror (not shown), to the first luminous flux 133, and a dichroic mirror 137 that is positioned between the liquid-crystal light valve 110 and the writing optical system 120 for making the first luminous flux 133 from the collimating lens 136 incident upon one side of the front substrate 112 of the liquid-crystal light valve 110 in perpendicular relation thereto. The second optical unit, or the magnifying lens system 134, includes a pair of first and second lenses 138 and 139 and an aperture stop 141 that is positioned at the focal position of the first and second lenses 138 and 139.

A super high pressure mercury-vapor lamp, whose output is 2 kW, is used as the light source 131. A wavelength selective filter (not shown) through which a g-line (436 nm) of the mercury-vapor lamp is selectively transmitted, and a cold filter (not shown) for cutting off the infrared light is arranged between the light source 131 and the collimating lens 136. The dichroic mirror 137 has such a wavelength selectivity as to reflect the ultraviolet light, but to permit transmission of the infrared light.

Accordingly, the dichroic mirror 137 does not serve as a mirror with respect to the infrared luminous flux from the writing optical system 120, but permits the writing light to reach the liquid-crystal light valve 110 without power attenuation. The dichroic mirror 137 also serves to reflect the g-line light, required for exposure of a photosensitive layer on the substrate 150, of the luminous flux from the light source 131, toward the liquid-crystal light valve 110, and to permit transmission of the infrared light, exerting influence upon the pattern formed by the writing optical system 120 so as not to introduce the infrared light towards the liquid-crystal light valve 110.

It is to be noted here that it is difficult to completely isolate heat from the light source 131. In view of this difficulty, the operating temperature of the liquid-crystal light valve 110 is originally set to a high valve of about 40 to 50 degrees Centigrade, and the environmental atmosphere is so controlled as to be brought to this temperature value.

The magnifying lens system 134, composed of the first and second lenses 138 and 139 and the aperture stop 141, constitutes a system that is telecentric to both the sides of the object space and the image space. Thus, the magnifying lens system 134 functions to magnify, at quintuple, the pattern formed in the liquid-crystal light valve 110, thereby projecting the magnified image onto the substrate 150 for the printed circuit board. In this connection, the photosensitive layer on the substrate 150 has maximum sensitivity of 10 to 50 mJ/cm$^2$ with respect to the g-line.

The embodiment of the invention illustrated in FIGS. 3 and 4 is described pn the assumption that the printed circuit board is approximately 600 mm × 750 mm in size. Accordingly, the second lens is 139 is 960 mm in diameter, and the liquid-crystal light valve 110 is 120 mm × 150 mm in size. The diameter of one pixel on the substrate 150, corresponding to one spot on the liquid-crystal light valve 110 is 50 μm, and the minimum line width is 75 μm. The projected spot diameter is not coincident with the minimum line width because the writing, due to the heating spot light 121 is carried out in such a manner that the distance between the center of one of each pair of adjacent projected spots and the center of the other projected spot is brought to 12.5 μm, as described above. Moreover, three spot lights are projected in the widthwise direction of the drawn line, while being partially overlapped with each other, to form a single line. Experiments have revealed that if the three lines are gathered to form the single line in the manner described above, the accuracy of pattern formation onto the photosensitive layer on the substrate 150 is enhanced.

The operation of the exposure apparatus, constructed as above, will be now described.

When the optically transparent liquid crystal layer 111 in the state determined by the alignment layers 117 and 118 is heated up to a liquid state and, subsequently, is rapidly cooled, the liquid crystal layer 111 is not returned to the original transparent orientation state, but rather becomes a focal-conic opaque state.

The above characteristic is utilized, and the heating spot light 121 is caused by the scanning optical system 123 to scan in accordance with a pattern to be written, while controlling the semiconductor layer 122 in an "ON" or "OFF" manner. The heating spot light 121 locally heats the.liquid crystal layer 111, and movement of the heating spot light 121 rapidly cools the liquid crystal layer 111. Thus, a pattern composed of opaque portions and transparent portions is formed in the liquid crystal layer 111. In this connection, the opaque portions are formed to extend in the thickness direction of the liquid crystal layer 111. If the light absorption layer 116 is sufficiently thin, the opaque portions are formed into a columnar shape, that is substantially equal in diameter to the heating spot light 121.

After the pattern has been formed in the liquid crystal layer 111, the light source 131 is turned ON to make the second luminous flux 135 incident upon the liquid-crystal light valve 110 in perpendicular relation thereto. If a condition of this perpendicular incidence is not satisfied, the line width is enlarged more than the case where the above perpendicular condition is satisfied, because each opaque portion has a certain thickness. This leads to results which are not preferable in the formation of a more fine pattern.

The luminous flux transmitted through the liquid-crystal light valve 110 is brought again to the luminous flux 135 through the first and second lenses 138 and 139, to expose the photosensitive layer on the substrate 150 for the printed circuit board. Since, however, the light quantity or intensity of the luminous flux transmitted through the opaque portions within the liquid-crystal light valve 110 and reaching the photosensitive layer on the substrate 150 is less than that transmitted through the transparent portions and reaching the photosensitive layer on the substrate 150, the photosensitive layer is photosensitized in conformity with a pattern to which the pattern formed within the liquid-crystal light valve 110 is magnified at quintuple.

It is not considered that the surface of the substrate 150 for the printed circuit board is perfectly flat, because the printed circuit board has a certain measure of size. However, if the arrangement is such that the luminous flux 135 to which the transmitted luminous flux is brought is directed onto the substrate 150 for the printed circuit board in perpendicular relation thereto, in the manner described above, it is possible to restrain the influence upon the projected pattern to a minimum, even if undulations exist on the surface of the substrate 150.

A way of setting the substrate 150 for the printed circuit board onto the table T will now be described.

In the apparatus illustrated in FIG. 3A, the positional relationship between the table T and the projected pattern can be maintained constant. Accordingly, if the positional relationship is detected beforehand, it is possible to eliminate the conventional operation in which the mask films are positioned with respect to the substrate 150 one by one.

For instance, bores are formed in the substrate 150, and the table T is provided thereon with pins which can be fitted, respectively, into the bores. Once the table T is positioned by experimental pattern projection, or the like, the pins are fitted, respectively, into the bores, thereby enabling the positioning to be easily carried out.

The arrangement may be such that the table T is slidable in the X and Y directions for minute positional adjustments, a sensor for optically detecting the position of the substrate 150 being provided on the projecting side, and the position of the table T being automatically controlled in response to an output from the sensor.

After the expiration of a predetermined exposure period of time, the substrate 150 for the printed circuit board is taken out and subjected to a development processing, an etching processing, and a processing to remove the photosensitive layer. Thus, the predetermined circuit pattern is formed on the substrate 150.

The pattern recorded within the liquid-crystal light valve 110 is stored. If it is desired to fully erase the recorded pattern, means for applying an electric field of several tens kV/cm to between the transparent electrodes 114 and 115, or means for raising the temperature of the liquid crystal layer 111 and gradually cooling the same under application of an electric field, or like means, should be employed. Depending upon the type of liquid crystal used, it is possible to partially erase the recorded pattern by laser-scanning under application of a voltage, or the like.

In the arrangement of the embodiment described above, the dichroic mirror 137 is interposed between the liquid-crystal light valve 110 and the writing optical system 120, even during writing. Since, however, writing and projecting are not carried out simultaneously, the arrangement may be such that when the writing is carried out, the dichroic mirror 137 is moved out of the optical path. With such an arrangement, it is possible to reduce the focal length of the writing optical system 120, thereby restricting the diameter of the heating spot light 121 to a smaller value.

Further, the embodiment illustrated in FIG. 3A, has been described on the assumption that the heating spot light 121 is circular in cross-sectional shape. However, it is difficult to bring the heating spot light 121 to be a completely circular cross-sectional shape. Rather it is inevitable that the heating spot light 121 is brought more or less to an elliptic cross-sectional shape, because a correcting optical element, such as a cylindrical lens or the like, is used for shaping the elliptic luminous flux emitted from the semiconductor laser 122, or for correction of a facet tilt error of a polygonal mirror employed in the scanning optical system 123.

It is possible, however, to make the elliptic heating spot light substantially equivalent to the circular heating spot light, if the elliptic heating spot light is so arranged as to have its minor axis extending parallel to the first scanning direction, and if the "ON" time duration of the semiconductor laser 122 is set to an adequate value.

Explained in a conceptional manner, if it is supposed that the liquid crystal layer 111 is heated within a circular range of 10 μm in diameter, a circular spot light of 10 μm in diameter can heat the circular range of the liquid crystal layer 111 without any movement of the circular spot light. However, it is possible even for an elliptic spot light having a major diameter of 10 μm and a minor diameter of 8 μm, to heat the circular range of the liquid crystal layer 111 in a manner like the case of the circular spot light, if the elliptic spot light is moved 2 μm in the direction along the minor axis while the elliptic spot light is continuously emitted. That is to say, heating can be carried out in a manner like the case of the circular spot light, if the "ON" time duration during the writing is extended more than the case of the circular spot light, correspondingly to the moving period of time through 2 μm.

In view of the above, the exposure apparatus described above is arranged such that the "ON" time duration corresponding to one spot from the semiconductor laser 122 incorporated in the writing optical system 120 is made adjustable to cancel out the influence due to a distortion in the sectional configuration of the heating spot light 121.

Figure 5:
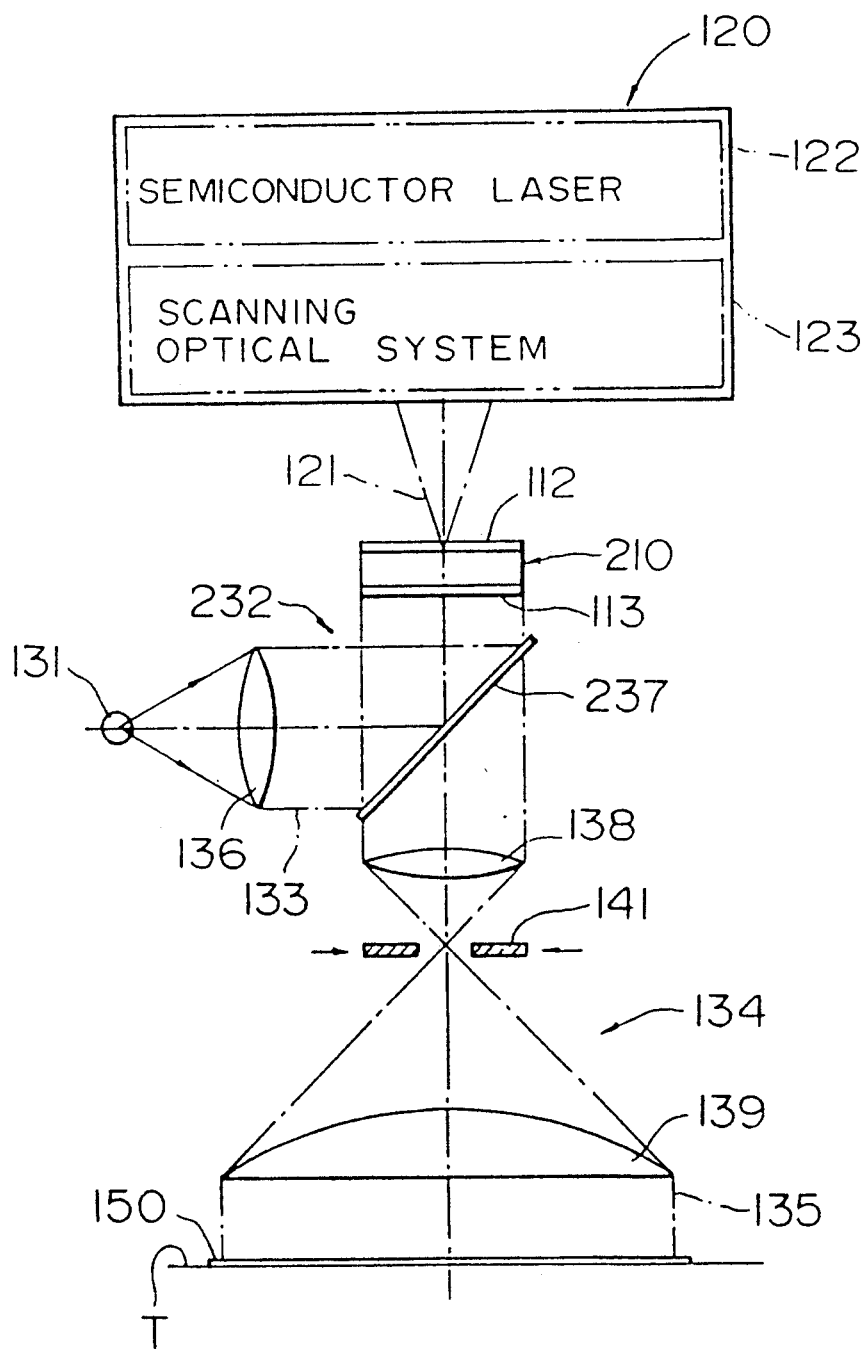
FIG. 5 is a view similar to FIG. 3A, but showing a modified exposure apparatus of the invention.
Figure 6:
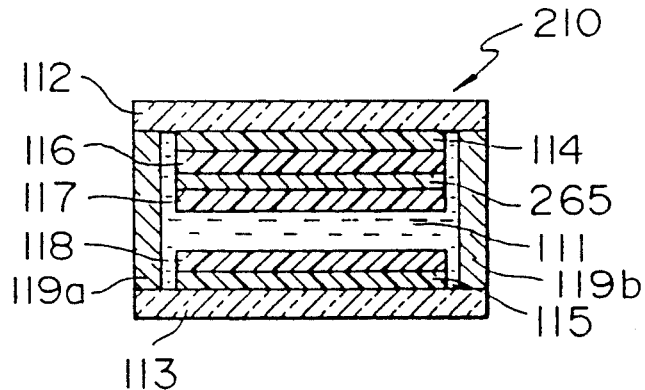
FIG. 6 is an enlarged cross-sectional view of a liquid-crystal light valve employed in the exposure apparatus illustrated in FIG. 5.

FIGS. 5 and 6 show a modified exposure apparatus according to the invention, which is of the so-called reflecting type, in which a projecting light is transmitted through the liquid-crystal layer twice.

In FIGS. 5 and 6, components and parts like or similar to those of the embodiment described with reference to FIGS. 3 and 4 are designated by the same or like reference numerals, and the like or similar components and parts will therefore be omitted to avoid repetition.

In the modification illustrated in FIGS. 5 and 6, a first optical unit 232 of the projecting optical system includes a half mirror 237 that is arranged between a liquid-crystal light valve 210 and the first lens 138 of the magnifying lens system 134. The luminous flux emitted from the light source 131 is incident upon the lower side of the rear substrate 113 of the liquid-crystal light valve 210. The luminous flux incident upon the liquid-crystal light valve 210 is reflected within the same and is again emitted through the rear substrate 113 of the liquid-crystal light valve 210. It is impossible for the arrangement illustrated in FIG. 5 to use a mirror having a wavelength selectivity like that employed in the previously described embodiments, because the luminous flux reflected and the luminous flux transmitted are equal in wavelength to each other.

The liquid-crystal light valve 210 has a light reflecting coating 265 formed of aluminum or the like, which is arranged between the light absorption layer 116 and the alignment layer 117, as shown in FIG. 6. The light absorption layer 116 is so set as to cooperate with the light reflecting coating 265 to form an interference layer, in order to reduce the distance between the light absorption layer 116 and the liquid crystal layer 111, as far as possible, to thereby restrain spreading, in a plain direction, of heat supplied by the heating spot light 121.

It is also possible for the exposure apparatus illustrated in FIGS. 5 and 6 to carry out the writing operation in a manner like that of the embodiment described previously. When the pattern formed within the liquid-crystal light valve 210 is projected, the light source 131 is turned ON, and the luminous flux from the light source 131 is brought to the first luminous flux 133 by the collimating lens 136. Of the first luminous flux 133, chiefly an ultraviolet light is made incident upon the rear substrate 113 of the liquid-crystal light valve 210 in perpendicular relation thereto, through a filter (not shown) and the half mirror 237. This luminous flux is transmitted through the liquid crystal layer 111, reflected by the light reflecting coating 265, and again transmitted through the liquid crystal layer 111. A part of the again reflected luminous flux is transmitted through the half mirror 237. The transmitted luminous flux is brought to the second luminous flux 135 by the first and second lenses 138 and 139. The second luminous flux 135 is made perpendicularly incident upon the substrate 150 for the printed circuit board, to expose the photosensitive layer on the substrate 150.

The exposure apparatus shown in FIGS. 5 and 6 can have an interchangeability with the exposure apparatus illustrated in FIGS. 3 and 4 in the arrangement including the writing optical system 120, the first and second lenses 138 and 139 and the like, if a spacing of the order enabling a mirror to be arranged is left between the writing optical system 120 and the liquid-crystal light valve 210 and between the liquid-crystal light valve 210 and the first lens 138.

Figure 7:
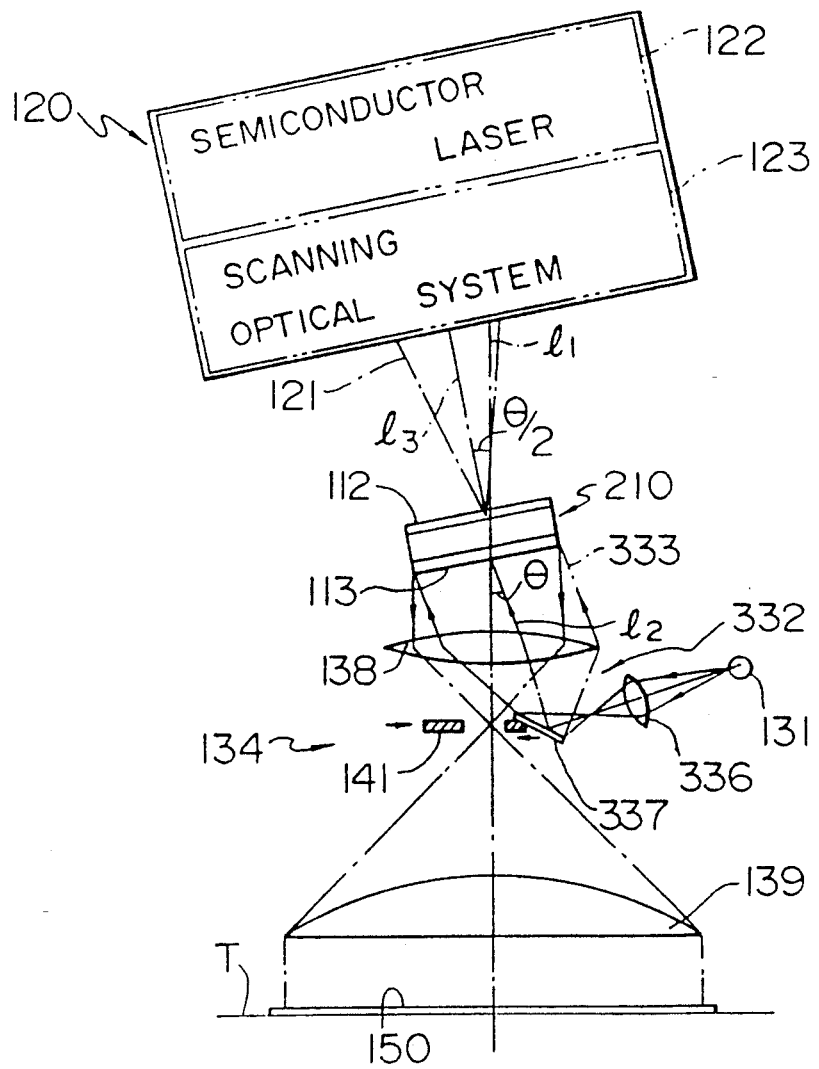
FIG. 7 is a view similar to FIG. 3A, but showing another modified exposure apparatus of the invention.

FIG. 7 shows anotehr modified exposure apparatus according to the invention, which is of a reflective type, employing the liquid-crystal light valve 210 illustrated in FIG. 6. In FIG. 7, components and parts liek or similar to those shown in FIGS. 3 through 6 are designated by the same or like reference numerals, and the description of such like or similar components and parts will therefore be omitted to avoid duplication.

In the modification shown in FIG. 7, a first optical unit 332 of the projecting optical system includes a total reflection mirror 337 which is arranged between the first lens 138 and the aperture stop 141 at a location out of an optical axis $l_1$ of the magnifying lens system 134. The first optical unit 332 further includes a condenser lens 336 arranged between the light source 131 and the total reflecting mirror 337. The condenser lens 336 cooperates with the first lens 138 to bring the projected luminous flux to a first luminous flux 333.

With the arrangement illustrated in FIG. 7, it is possible to eliminate a loss of light intensity or quantity due to the use of a half mirror like that employed in the modification shown in FIG. 5, and to reduce the exposure time duration, if the exposure apparatus shown in FIG. 7 uses a light source having the same output as that employed in the exposure apparatus shown in FIG. 5.

It is to be noted here that, with the arrangement illustrated in FIG. 7, the optical axis $l_2$ of the first luminous flux 333 reflected by the total reflecting mirror 337 toward the liquid-crystal light valve 210 forms a predetermined angle $\theta$ with respect to the optical axis $l_1$ of the lenses 138 and 139. Accordingly, in order to make the luminous flux reflected by the reflecting coating 265 (see FIG. 6) within the liquid-crystal light valve 210 coincident with the optical axis $l_1$, a normal line $l_3$ to the front substrate 112 of the liquid-crystal light valve 210 is required to be inclined at an angle $\theta/2$ with respect to the optical axis $l_1$. However, if the liquid-crystal light valve 210 is arranged obliquely, the line width obtained by the other projection is enlarged more than the case satisfying the perpendicular condition, because the liquid crystal layer 111 (see FIG. 6) has a certain measure of thickness.

Accordingly, it is necessary for the apparatus shown in FIG. 7 to determine the specifications in consideration of the above conditions.

When a pattern is projected onto the substrate 150 for the printed circuit board, according to the exposure apparatus constructed as above and shown in FIG. 7, the luminous flux emitted from the light source 131 is brought to the first luminous flux 333 through the condenser lens 336 and the first lens 138, and is incident upon the rear substrate 113 of the liquid-crystal light valve 210 at the angle of $\theta/2$. The luminous flux is transmitted through the liquid crystal layer 111 (see FIG. 6), twice and is again incident upon the first lens 138. The luminous flux is brought to the second luminous flux 135 through the first and second lenses 138 and 139. The second luminous flux 135 is directed onto the substrate 150 for the printed circuit board.

Other construction and operation of the apparatus shown in FIG. 7 are similar to those of the apparatus illustrated in FIG. 3A or 5.

As described above, according to the exposure apparatus shown in FIG. 3A, 5 or 7, exposure processing can be carried out without the use of mask films, unlike the conventional exposure apparatus. This makes it possible to facilitate the positioning of a pattern formation relative to the substrate 150. Further, since no mask films are in contact with the substrate 150, there is no anxiety of a reduction in accuracy of the pattern due to flaws on the substrate 150. The processing efficiency can be improved, because the period of time required for vacuum evacuation is dispensed with. Moreover, since the liquid-crystal light valve 110 (or 210) can be rewritten and be reused, high cost performance can be realized, particularly in the case of a multi-kind, small-quantity production operation.

Furthermore, the setting of the substrate 150 for the printed circuit board can be fully automated in connection with the easiness of the positioning described above, and the opposite sides of the substrate 150 can be simultaneously exposed if the exposure apparatuses are arranged respectively on the both sides of the substrate 150.

Apart from the above, telecentricity is required for the magnifying lens system 134 of each of the apparatuses illustrated, respectively, in FIGS. 3A, 5 and 7, in order to avoid a shift or displacement or a distortion of the drawn pattern, even if undulations exist on the surface to be drawn, i.e, the surface of the substrate 150 for the printed circuit board.

For instance, in the case where a value on the order of ±1 mm is tolerated for the flatness of the substrate 150, when a lens whose focal length is 1,000 mm is employed at a magnification of seven, an error at the image position on the surface of the substrate 150 reaches ±60 μm (±120 μm along the diagonal), if an incident angle of a principle ray is supposed to 3.5 degrees at the image height of 500 mm above the surface of the substrate 150 is arranged perpendicularly to the optical axis of the first and second lenses 138 and 139. This raises a problem.

The surface of the substrate 150 supposed here is 700×700 mm (approximately 1 m along the diagonal) in size. In this case, for such a construction that a plurality of large-diameter lenses of the order of 1 m in diameter are arranged to obtain the telecentricity, it is impossible to require high imaging performance or high aberration correction performance. The reason for this is that, since glass material capable of ensuring the uniformity of an internal refractive index is in fact limited to Bk7, there is no degree of freedom in selection of the glass material, and the fabricating accuracy cannot be called for strictly or severely.

FIGS. 8, 9, 11, 12, 14 and 15 show respectively, first, second and third exemplifications of the magnifying lens system 134 employed in each of the exposure apparatuses illustrated, respectively, in FIGS. 3A, 5 and 7. In each of the magnifying lens systems shown in FIGS. 8, 11 and 14, only the last lens on the side of the substrate 150 shown in FIG. 3A, 5 or 7, which corresponds to the second lens 139, is formed by a large-diameter convex lens II relatively loose in processing accuracy to meet the telecentric requirements. A lens system arranged on the side of the liquid-crystal light valve 110 (or 210), shown in FIG. 3A, 5 or 7, which corresponds to the first lens 138, is formed by a plurality of groups of small-diameter lenses I in order to secure the excellent performance of the entire lens system.

The groups of small-diameter lenses I have, as a whole, a positive refractive power. The large-diameter convex lens II has its one side which is flat and which is directed toward the substrate 150. The large-diameter convex lens II is arranged between the groups of small-diameter lenses I and the substrate 150. A focal length f of the entire magnifying lens system, a focal length $f_I$ of the groups of small-diameter lenses I, a focal length $f_{II}$ of the large-diameter lens II and a distance $d_{I-II}$ between the groups of small-diameter lenses I and the large-diameter lens II satisfy the following three inequalities:

$$0.5 < d_{I-II}/f < 2, \quad (1)$$

$$0.05 < f_I/f < 0.4, \text{ and} \quad (2)$$

$$0.8 < f_{II}/f < 3 \quad (3)$$

The large-diameter lens II is arranged in considerably spaced relation to the groups of small-diameter lenses I, and primarily serves as a condenser lens for realizing the teleconcentricy. Because the large-diameter lens II is a positive single lens, the large-diameter lens II is not independently corrected in chromatic aberration, spherical aberration and the like. Accordingly, it is necessary to beforehand correct these aberrations by the group of small-diameter lenses I.

Each of the lenses forming the groups of small-diameter lenses I is subjected to relatively high precision treatments, to carry out aberration correction of the entire magnifying projecting lens system The above inequalities (1) through (3) are condition for carrying out correction of various aberrations with a good balance and, in addition thereto, for securing the requisite telecentricity.

If $d_{I-II}/f$ in the inequality (1) exceeds the upper limit, the spacing between the groups of small-diameter lenses I and the large-diameter lens II becomes excessively large, resulting in a disadvantage in correction of the chromatic aberration, and in particular, the lateral chromatic aberration. Moreover, the incident height of the light to the large-diameter lens II increases, making a correction of the distortion aberration difficult. Furthermore, it results in a useless increase in the length of the entire magnifying lens system. On the other hand, if $d_{I-II}/f$ falls below the lower limit, the spacing between the groups of small-diameter lenses I and the large-diameter lens II becomes short excessively, making it difficult to realize the telecentricity.

The chromatic aberration will now be explained. In an exposure apparatus like that according to the invention, there are many cases where a light source, such as a high pressure mercury lamp or the like, is used in combination with a monochromatic filter to form a single wavelength. Since, however, the spectrum has a broadness on the order of 10 through 20 nm, the wavelength is not completely monochromatic. Accordingly, correction of the chromatic aberration must be taken into account with respect to the wavelengths on the order of the spectrum width.

Inequality (2) indicates a distribution of refractive power of the groups of small-diameter lenses I with respect to the entire system. A strong refractive power is set in the groups of small-diameter lenses I, as compared with the large-diameter lens II, in order to obtain excellent telecentricity. If $f_I/f$ exceeds the upper limit, the refractive power of the groups of small-diameter lenses I becomes weak, so that a load or burden of the refractive power is applied to the large-diameter lens II in order to obtain a desirable refractive power as the entire system. Accordingly, because the large-diameter lens II is a single le0s, a spherical aberration and a chromatic aberration which are insufficient in correction occur so that excellent performance cannot be retained. On the other hand, if $f_I/f$ falls below the lower limit, the refractive power is excessively strengthened, and the spacing $d_{I-II}$ is shortened, so that it is no longer possible to secure the telecentricity.

Inequality (3) represents a distribution of refractive power of the large-diameter lens II with respect to the entire system. If $f_{II}/f$ exceeds the upper limit, the refractive power of the large-diameter lens II becomes weak. In order to secure the telecentricity, the spacing $d_{I-II}$ is lengthened, making correction of a chromatic aberration difficult. Correction of a chromatic aberration makes it impossible to secure the telecentricity. On the other hand, if $f_{II}/f$ falls below the lower limit, the refractive power of the large-diameter lens II is strengthened and the spacing $d_{I-II}$ is shortened, making it difficult to secure the telecentricity.

Figure 9:
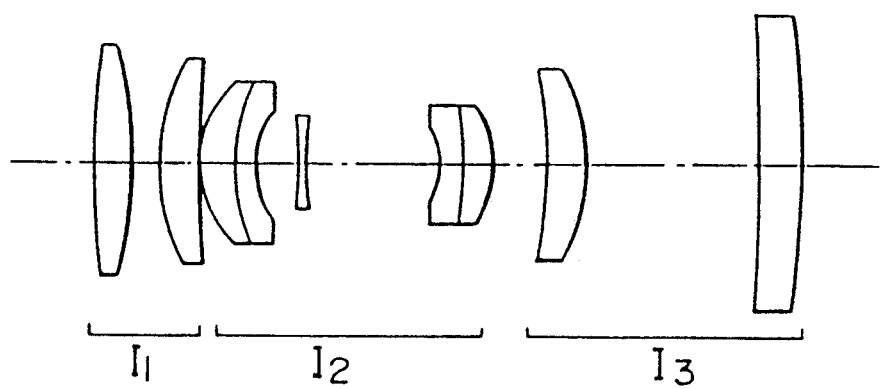
FIG. 9 is an enlarged side elevational view of a plurality of groups of small-diameter lenses illustrated in FIG. 8.
Figure 12:
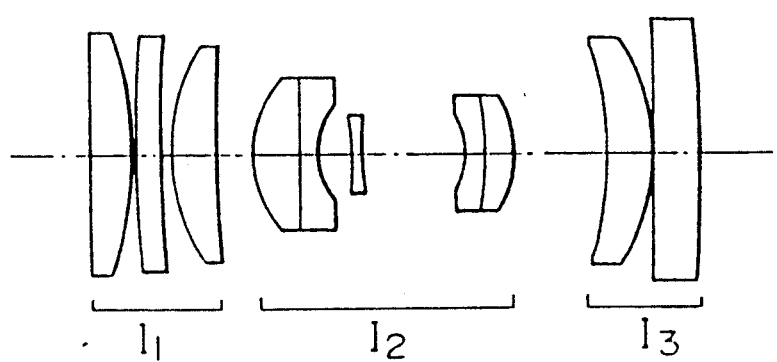
FIG. 12 is an enlarged side elevational view of a plurality of groups of small diameter lenses illustrated in FIG. 11.

Furthermore, as shown in FIGS. 9, 12 or 15, the groups of small-diameter lenses I are composed of first, second and third groups $I_1$, $I_2$ and $I_3$ whose respective refractive powers are positive, negative and positive The first, second and third groups $I_1$, $I_2$ and $I_3$ are arranged in the order from the side of the liquid-crystal light valve 110 (or 210), shown in FIG. 3, 5 or 7. The first, second and third groups $I_1$, $I_2$ and $I_3$ have their respective focal lengths $f_{I1}$, $f_{I2}$ and $f_{I3}$ which are set to satisfy the following inequalities:

$$0.5 < |f_{I1}/f_{I1}| < 1.5 \quad (4)$$

$$1.4 < |f_{I3}/f_{I2}| < 2.5 \quad (5)$$

If the above inequalities (4) and (5) are satisfied, an increase in the Petzval sum can be restrained, making it possible to properly correct a curvature of field.

It is preferable to satisfy conditions (4) and (5) in order to cancel out a positive Petzval sum resulting from the positive lenses of the first and third groups $I_1$ and $I_3$, by the negative lenses of the second group $I_2$. If bouth $f_{I1}/f_{I2}$ and $f_{I3}/f_{I2}$ exceed their respective upper limits, the negative refractive power becomes excessively strong. This is advatnageous for reducing of the Petzval sum. However, higher order aberrations remain because of the excessive correction, resulting in a deterioration of the image quality. If both fI1/fI2 and fI3/fI2 fall below their respective lower limits, the Petzval sum increases, resulting in a deterioration of the curvature of field.

In addition to the above, each of the first and third groups of small-diameter lenses $I_1$ and $I_3$ includes at least two positive lenses. The second group of small-diameter lenses $I_2$ includes a first pair of positive and negative bonded meniscus lenses in the order from the side of the liquid-crystal light valve 110 (or 210) shown in FIGS. 3, 5 or 7. The meniscus lens has a negative refractive power and has a convex side directed toward the liquid-crystal light valve. The second group $I_2$ further includes a single lens whose focal length is $f_{I22}$, and a second pair of negative and positive bonded meniscus lenses in the order from the side of the liquid-ycrystal light valve. The meniscus lense has a negative refractive power and has a convex side directed toward the substrate 150 shown in FIGS. 3, 5 or 7. Setting is made to satisfy the following inequality:

$$0.5 < |f_{I22}/f_I| < 4 \quad (6)$$

If the inequality (6) is satisfied, it is possible to meet the aberration correction conditions for the sake of a Gauss type lens system In the Gauss type lens system, a pair of intensive concave faces facing towards each other reduce the Petzval sum. At the same time, however, these concave faces cause occurrence of a sagittal flare. Accordingly, it is preferable that,glass material having as high a refractive index as possible is used and that the curvature of each of the concave faces is set to be small Moreover, since the negative single lens having the focal length $f_{I22}$ and arranged between both the concave faces has a function of bearing a share of the negative refractive power, the negative single lens is effective in restraining occurrence of the sagittal flare. Inequality (6) determines the refractive force of the negative single lens. If $f_{I22}/f_I$ exceeds the upper limit, the refractive power becomes excessively weak so that the effect of restraining the sagittal flare disappears. On the other hand, if $f_{I22}/f_I$ falls below the lower limit, the refractive power becomes excessively strong so that it is impossible to take a large angle of view.

The meniscus lenses arranged respectively at both ends of the second group $I_2$ are formed into bonded lenses for the purpose of a chromatization. The exposure apparatus according to the invention supposes that the photosensitive material has its sensitivity in the vicinity of the g-line. As previously mentioned, since the spectrum in the vicinity of the g-line has a width, it is required to effect a chromatization within the wavelength range. For this purpose, it is preferable that the following inequality is satisfied:

$$15 < \gamma_{I2+} - \gamma_{I2-} \quad (7)$$

where $\gamma_{I2+}$ and $\gamma_{I2-}$ are values of $\gamma_{436}$ of the respective positive and negative lenses in the second group $I_2$, which is defined by the following equation on the basis of a refractive index $n\gamma$ at a wavelength $\gamma$:

$$\nu 436 = \frac{n_{436} - 1}{n_{416} - n_{456}}$$

Satisfaction of inequality (7) enables the refractive powers of the respective positive and negative lenses to be well balanced with each other, making it possible to realize a correction of the chromatic aberration as well as a correction of other various aberrations.

Incidentally, the first group $I_1$ may include a negative lens for correction of the chromatic aberration.

Figure 8:
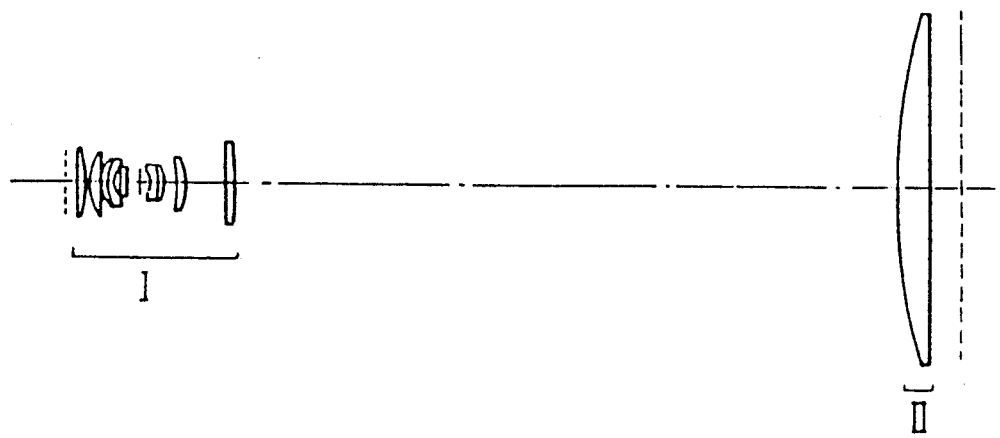
FIG. 8 is a schematic side elevational view of a first exemplification of a magnifying lens system capable of being incorporated in a projecting optical system of any one of the exposure apparatuses illustrated respectively in FIGS. 3A, 5 and 7.

Table 1 indicates specific design numerals of the,first exemplification shown in FIGS. 8 and 9. In the Table 1, the characters f, M, r, d and ng represent, respectively, a focal length of the entire system, a magnification of the entire system, a radius of curvature of each lens surface, the distance (lens thickness and air spacing) between both surfaces, and a refractive index at the g-line (436 nm).

Various aberrations of the lens system designed on the basis of Table 1, are shown in FIGS. 10a through 10e. In FIG. 10a, the solid line SA indicates a spherical aberration, and the broken line SC indicates a sine condition. In a chromatic aberration and a lateral chromatic aberration along the axis (FIGS. 10b and 10c), three data including 436, 416 and 456 nm are indicated. In an astigmatism (FIG. 10d) the solid line represents the saggital direction S, and the broken line indicates the meridional direction M.

Figure 11:
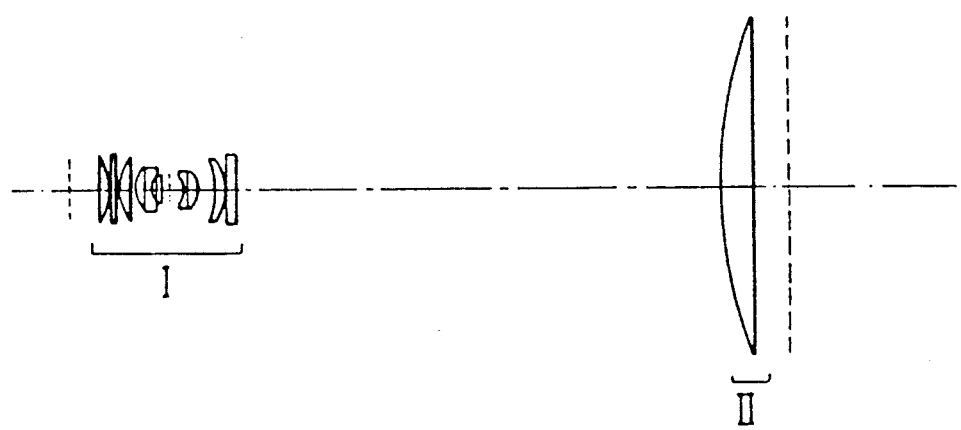
FIG. 11 is a view similar to FIG. 8, but showing a second exemplification of the magnifying lens system.

Likewise, specific numerals of the second exemplification, illustrated in FIGS. 11 and 12, are indicated in Table 2, and various aberrations are shown in FIGS. 13a through 13e.

Moreover, specific numerals of the third exemplification illustrated in FIGS. 14 and 15, are indicated in Table 3, and various aberrations are shown in FIGS. 16a and 16c.

Each of the first through third exemplifications are employed at a magnification of seven and within a range of an image height of 480 mm. Excellent chromatic aberration correction is carried out within the spectrum width of the g-line (wavelength 436 nm) ±20 nm. In this connection, in each of the exemplifications, the telecentricity is within 0 to 2 degrees.

TABLE 1

<<NUMERALS IN FIRST EXEMPLIFICATION>>
f = 1513.74 M = −7.000

|    | r         | d       | ng      | ν436  |
|----|-----------|---------|---------|-------|
| 1  | 621.165   | 25.00   | 1.71234 | 110.1 |
| 2  | −341.674  | 17.68   |         |       |
| 3  | 150.277   | 25.75   | 1.71234 | 110.1 |
| 4  | 693.856   | 1.14    |         |       |
| 5  | 78.688    | 22.27   | 1.60108 | 121.4 |
| 6  | 153.386   | 10.22   | 1.63427 | 67.8  |
| 7  | 57.260    | 28.85   |         |       |
| 8  | −416.062  | 8.20    | 1.67253 | 61.1  |
| 9  | 752.717   | 84.39   |         |       |
| 10 | −53.357   | 14.67   | 1.64853 | 65.0  |
| 11 | −422.701  | 19.88   | 1.68449 | 113.5 |
| 12 | −85.461   | 36.56   |         |       |
| 13 | −317.191  | 24.91   | 1.71234 | 110.1 |
| 14 | −147.703  | 114.76  |         |       |
| 15 | −3026.959 | 27.50   | 1.71234 | 110.1 |
| 16 | −856.658  | 1947.83 |         |       |
| 17 | 1608.229  | 92.17   | 1.52621 | 129.3 |
| 18 | ∞         |         |         |       |

Conditional expressions:
(1) $d_{I-II}/f = 1.29$
(2) $f_I/f = 0.23$
(3) $f_{II}/f = 2.02$
(4) $|f_{I1}/f_{I2}| = 0.86$
(5) $|f_{I3}/f_{I2}| = 1.86$
(6) $|f_{I2}/f_I| = 1.15$
(7) $\nu_{I2+} - \nu_{I2-} > 45.7$

TABLE 2

<<NUMERALS IN SECOND EXEMPLIFICATION>>
f = 904.80 M = −7.000

|    | r         | d       | ng      | ν436  |
|----|-----------|---------|---------|-------|
| 1  | 23960.200 | 27.33   | 1.65310 | 120.9 |
| 2  | −249.485  | 3.70    |         |       |
| 3  | 1755.771  | 15.85   | 1.71782 | 55.6  |
| 4  | 1678.570  | 7.37    |         |       |
| 5  | 153.829   | 27.03   | 1.65310 | 120.9 |
| 6  | 826.532   | 24.65   |         |       |
| 7  | 85.415    | 31.37   | 1.60107 | 121.4 |
| 8  | −1327.286 | 12.13   | 1.64655 | 72.2  |
| 9  | 60.027    | 19.96   |         |       |
| 10 | −2626.007 | 8.23    | 1.69298 | 59.7  |
| 11 | 860.916   | 67.10   |         |       |
| 12 | −59.529   | 13.27   | 1.69186 | 72.4  |
| 13 | −202.511  | 17.90   | 1.65310 | 120.9 |
| 14 | −94.814   | 62.15   |         |       |
| 15 | −267.543  | 29.94   | 1.65310 | 120.9 |
| 16 | −143.714  | 1.00    |         |       |
| 17 | −6139.621 | 30.00   | 1.65310 | 120.9 |
| 18 | −1337.197 | 1426.47 |         |       |
| 19 | 1300.276  | 95.78   | 1.52621 | 129.3 |
| 20 | ∞         |         |         |       |

Conditional expressions:
(1) $d_{I-II}/f = 1.58$
(2) $f_I/f = 0.31$
(3) $f_{II}/f = 2.73$
(4) $|f_{I1}/f_{I2}| = 0.91$
(5) $|f_{I3}/f_{I2}| = 2.03$
(6) $|f_{I2}/f_I| = 3.28$
(7) $\nu_{I2+} - \nu_{I2-} > 48.5$

TABLE 3

<<NUMERALS IN THIRD EXEMPLIFICATION>>
f = 2905.15 M = −7.000

|    | r         | d       | ng      | ν436  |
|----|-----------|---------|---------|-------|
| 1  | 777.754   | 25.39   | 1.74570 | 144.8 |
| 2  | −277.629  | 1.91    |         |       |
| 3  | 148.112   | 24.98   | 1.68449 | 113.5 |
| 4  | 654.911   | 1.00    |         |       |
| 5  | 76.882    | 21.52   | 1.60107 | 121.4 |
| 6  | 119.992   | 9.98    | 1.63426 | 67.8  |
| 7  | 56.424    | 34.72   |         |       |
| 8  | −347.386  | 8.35    | 1.67253 | 61.1  |
| 9  | 560.499   | 82.28   |         |       |
| 10 | −53.162   | 14.10   | 1.64852 | 65.0  |
| 11 | −453.810  | 19.33   | 1.68449 | 113.5 |
| 12 | −84.483   | 30.80   |         |       |
| 13 | −349.116  | 25.50   | 1.68449 | 113.5 |
| 14 | −146.685  | 199.79  |         |       |
| 15 | −2768.287 | 27.50   | 1.71234 | 110.1 |
| 16 | −756.438  | 1945.08 |         |       |
| 17 | 1522.518  | 100.64  | 1.52621 | 129.3 |
| 18 | ∞         |         |         |       |

Conditional expressions:
(1) $d_{I-II}/f = 0.67$
(2) $f_I/f = 0.13$
(3) $f_{II}/f = 1.00$
(4) $|f_{I1}/f_{I2}| = 0.88$
(5) $|f_{I3}/f_{I2}| = 2.04$
(6) $|f_{I2}/f_I| = 0.87$
(7) $\nu_{I2+} - \nu_{I2-} > 45.7$ As described above, according to the first, second and third exemplifications shown in FIGS. 8 through 16, a magnifying lens system that is capable of projecting a magnified image, with a high resolution, onto a large surface of the substrate for the printed circuit board an the order of 700×700 mm, can be provided by a combination of the large-diameter lens II and the groups of small-diameter lenses I. Accordingly, it is unnecessary that the entire system is composed of large-diameter lenses, and requirements for severe treatment accuracy are limited to the groups of small-diameter lenses I, making it possible to facilitate the manufacturing of the magnifying lens system.

Further, satisfaction of the predetermined conditions enables various aberrations, such as the curvature of field, the chromatic aberration and the like to be satisfactorily corrected. Thus, the lens systems shown in FIGS. 8 through 16 are suitable for use with a projecting system, such as a LSLV (Laser Scan Light Valve) or the like, for which extreme accuracy is required.

What is claimed is:

1. An exposure apparatus for exposing a subject with an optical image, comprising:
    a thermally-written liquid-crystal light valve having accommodated therein a liquid crystal layer;
    means for reciprocatively moving said liquid-crystal light valve in a first direction;
    means for writing a predetermined pattern into said liquid-crystal light valve; and
    an optical projection system comprising:
        means for illuminating said thermally-written liquid-crystal light valve; and
        means for bringing a luminous flux from said illuminated thermally-written liquid-crystal light valve to a substantially telecentric luminous flux and for illuminating said subject with said telecentric luminous flux, whereby said subject is exposed to an optical image corresponding to said predetermined pattern into which said liquid crystal layer is formed, said luminous flux bringing means including a magnifying lens system that comprises a group of small-diameter lenses having a positive refractive powr as a whole, and a large-diameter convex lens having one side that is flat and which is directed towards said subject, said large-diameter convex lens being arranged between said group of small-diameter lenses and said subject, and wherein a focal length f of the entire magnifying lens system, a focal length $f_I$ of said group of small-diameter lenses, a focal length $f_{II}$ of said large-diameter convex lens and a distance $d_{I\text{-}II}$ between said group of small-diameter lenses and said large-daimeter convex lens satisifies the following inequalities:

$0.5 < d_{I\text{-}II}/f < 2;$
$0.05 < f_I/f < 0.4;$ and
$0.8 < f_{II}/f < 3.$

2. The exposure apparatus according to claim 1, wherein said group of small-diameter lenses include first, second and third groups whose respective refractive powers are positive, negative and positive, said first, second and third groups being arranged in an order from a side of said liquid-crystal light valve, said first, second and third groups having respective focal lengths $f_{I1}$, $f_{I2}$ and $f_{I3}$ which satisfy the following inequalities:

$0.5 < |f_{I1}/f_{I2}| < 1.5,$ and $1.4 < |f_{I3}/f_{I2}| < 2.5.$

3. The exposure apparatus according to claim 2, wherein each of said first and third groups of small-diameter lenses includes at least two positive lenses, wherein said second group of small-diameter lenses include a first pair of positive and negative bonded meniscus lenses in an order from a side of said liquid-crystal light valve, said first pair of meniscus lenses having a negative refractive power and having a convex side directed toward said liquid-crystal light valve, a single lens whose focal length is $f_{I22}$, and a second pair of negative and positive bonded meniscus lenses in an order from said side of said liquid-crystal light valve, said second pair of meniscus lenses having a negative refractive power and having a convex side directed toward said subject, and wherein the following inequalities are satisfied:

$0.5 < |f_{I22}/f_I| < 4,$ and $15 < \gamma_{I2+} - \gamma_{I2-}$ where $\gamma_{12+}$ and $\gamma_{12-}$ are values of $\gamma_{436}$ of respective positive and negative lenses in said second group, which is defined by the following equation on the basis of a refractive index $n\lambda$ at a wavelength $\lambda$:

$$\nu_{436} = \frac{n_{436} - 1}{n_{416} - n_{456}}.$$

4. An exposure apparatus for exposing a subject with an optical image, comprising:
a thermally-written liquid-crystal light valve having accommodated therein a liquid crystal layer;
means for writing a predetermined pattern into said liquid-crystal light valve; and
an optical projection system comprising:
means for illuminating said thermally-written liquid-crystal light valve; and
means for bringing a luminous flux from said illuminated thermally-written liquid-crystal light valve to a substantially telecentric luminous flux and for illuminating said subject with said telecentric luminous flux, whereby said subject is exposed to an optical image that corresponds to said predetermined pattern into which said liquid crystal layer is formed, said luminous flux bringing means including a magnifying lens system that comprises a group of small-diameter lens group having a positive refractive powr as a whole, and a large-diameter convex lens having one side that is flat and which is directed towards said subject, said large-diameter convex lens being arranged between said group of small-diameter lens group an said subject, and wherein a focal length f of the entire magnifying lens system, a focal length $f_I$ of said small-diameter lens group, a focal length $f_{II}$ of said large-diameter convex lens and a distance $d_{I\text{-}II}$ between said group of small-diameter lenses and said large-diameter convex lens satisifies the following inequalities:

$0.5 < d_{I\text{-}II}/f < 2;$
$0.05 < f_I/f < 0.4;$ and
$0.8 < f_{II}/f < 3.$

5. The exposure apparatus of claim 4, wherein said small-diameter lens group include first, second and third lens groups whose respective refractive powers are positive, negative and positive, said first, second and third lens groups being arranged in an order from a side of said liquid-crystal light valve.

6. The exposure apparatus of claim 5, wherein said first, second and third lens groups, having respective focal lengths of $f_{I1}$, $F_{I2}$ and $F_{I3}$ satisfy the following inequalities:

$0.5 < |f_{I1}/f_{I2}| < 1.5;$ and $1.4 < |f_{I3}/f_{I2}| < 2.5$

7. The exposure apparatus of claim 6, wherein said first and third lens groups of said small-diameter lens group include at least two positive lenses, and said second lens group of said small-diameter lens group includes a first pair of positive and negative bonded meniscus lenses in an order from a side of said liquid-crystal light valve, said first pair of meniscus lenses having a negative refractive power and having a convex side directed towards said liquid-crystal light valve, a single lens whose focal length is $f_{I22}$, and a second pair of negative and positive bonded meniscus lenses in an order from a side of said liquid-crystal light valve, said second pair of meniscus lenses having a negative refractive power and having a convex side directed towards said subject.

8. The exposure apparatus of claim 7, wherein the following inequalities are satisfied:

$0.5 < |f_{I22}/f_I| < 4;$ and $15 < \gamma_{I2+} - \gamma_{I2-},$ where $\gamma_{I2+}$ and $\gamma_{I2-}$ are values of $\gamma_{436}$ of the respective positive and negative lenses in said second group, which is defined by the following equation on the basis of a refractive index $n\lambda$ at a wavelength $\lambda$:

$\gamma_{436} = (n_{436} - 1)/(n_{416} - n_{456}).$

9. An exposure apparatus for exposing a subject with an optical image, comprising:
a thermally-written liquid-crystal light valve having accommodated therien a liquid crystal layer;

means for reciprocatively moving said liquid-crystal light valve in a Y direction;

means for emitting an optical writing heat spot onto said liquid-crystal light valve, said optical writing heat spot being reciprocatively movable in an X direction, at least oen fo said liquid-crystal light valve and emitting means being movable relative to each other to cause said heating spot to write a predetermined pattern into said liquid-crystal light valve; and optical projection system having a light source, a first optical means arranged between said light source and said liquid-crystal light valve for transmitting a first luminous flux that is emitted from said light source, through said liquid crystal layer formed into said predetermined pattern, and second optical means arranged between said liquid-crystal light valve and said subject for bringing a luminous flux transmitted through said liquid crystal layer to a substantially telecentric second luminous flux, whereby said subject is exposed to an optical image that corresponds to said predetermined pattern into which said liquid crystal layer is formed, said second optical means having a magnifying lens system that comprises a small-diameter lens group having a positive refractive power as a whole and a large-diameter convex lens having one side that is flat and which is directed towards said subject, said large-diameter convex lens being arranged between said small-diameter lens group and said subject, wherein a focal length f of the entire magnifying lens system, a focal length $f_I$ of said small-diameter lens group, a focal length $f_{II}$ of said large-diameter convex lens and a distance $d_{I\text{-}II}$ between said group of small-diameter lens group and said large-diameter convex lens satisifies the following inequalities:

$0.5 < d_{I\text{-}II}/f < 2$;
$0.05 < f_I/f < 0.4$; and
$0.8 < f_{II}/f < 3$.

10. An exposure apparatus for exposing a subject with an optical image, comprising:
a thermally-written liquid-crystal light valve being accommodated therein a liquid crystal layer;
means for reciprocatively shifting said liquid-crystal light valve in a first detection;
means for illuminating said thermally-written liquid-crystal light valve;
means for reciprocatively shifting a luminous flux from said illuminated thermally-written liquid-crystal light valve in a second direction so as to write a predetermined pattern into said light-crystal light valve; and
means for projecting said luminous flux transmitted by said liquid-crystal layer to a substantially telecentric luminous flux so as to illuminate a subject with said telecentric luminous flux, whereby said subject is exposed to an optical image corresponding to said predetermined pattern into which said liquid crystal layer is formed, said projecting means comprising:
a magnifying lens system having small-diameter lens group having a positive refractive power as a whole, and a large-diameter convex lens having one side that is flat and which is directed towards said subject, said large-diameter convex lens being arranged between said small-diameter lens group and said subject, wherein a focal length f of the entire magnifying lens system, a focal length $f_I$ of said small-diameter lens group, a focal length $f_{II}$ of said large-diameter convex lens and a distance $d_{I\text{-}II}$ between said small-diameter lens group and said large-diameter convex lens satisfies the following inequalities:

$0.5 < d_{I\text{-}II}/f < 2$;
$0.05 < f_I/f < 0.4$; and
$0.8 < f_{II}/f < 3$.

11. The exposure apparatus of claim 10, wherein said small-diameter lens group include first, second and third lens groups whose respective refractive powers are positive, negative and positive, said first, second and third lens groups being arranged in an order from a side of said liquid-crystal light valve.

12. The exposure apparatus of claim 11, wherein said first, second and third lens groups, having respective focal lengths of $f_{I1}$, $F_{I2}$ and $F_{I3}$ satisfy the following inequalities:

$0.5 < |f_{I1}/f_{I2}| < 1.5$; and $1.4 < |f_{I3}/f_{I2}| < 2.5$

13. The exposure apparatus of claim 12, wherein said first and third lens groups of said small-diameter lens group include at least two positive lenses, and said second lens group of said small-diameter lens group includes a first pair of positive and negative bonded meniscus lenses in an order from a side of said liquid-crystal light valve, said first pair of meniscus lenses having a negative refractive power and having a convex side directed towards said liquid-crystal light valve, a single lens whose focal length is $f_{I22}$, and a second pair of negative and positive bonded meniscus lenses in an order from a side of said liquid-crystal light valve, said second pair of meniscus lenses having a negative refractive power and having a convex side directed towards said subject.

14. The exposure apparatus of claim 13, wherein the following inequalities are satisfied:

$0.5 < |f_{I22}/f_I| < 4$; and $15 < \gamma_{I2+} - \gamma_{I2-}$, where $\gamma_{I2+}$ and $\gamma_{I2-}$ are values of $\gamma_{436}$ of the respective positive and negative lenses in said second group, which is defined by the following equation on the basis of a refractive index $n\lambda$ at a wavelength $\lambda$:

$\gamma_{436} = (n_{436} - 1)/(n_{416} - n_{456})$.

15. An optical projection system, comprising:
means for illuminating a thermally-written liquid-crystal light valve; and
means for bringing a luminous flux from said illuminated thermally-written liquid-crystal light valve and for illuminating a subject with a telecentric luminous flux, whereby said subject is exposed to an optical image that corresponds to a predetermined pattern formed into a liquid crystal layer of said liquid-crystal light valve, said luminous flux bringing means having a magnifying lens system that comprises a small-diameter lens group having a positive refractive power as a whole and a large-diameter convex lens having one side that is flat and which is directed towards said subject, said large-diameter convex lens being arranged between said small-diameter lens group and said subject, wherein a focal length f of the entire magnifying lens system, a focal length $f_I$ of said small-diameter lens group, a focal length $f_{II}$ of said large-diameter convex lens and a distance $d_{I\text{-}II}$ between said small-diameter lens group and said large-diameter convex lens satisfies the following inequalities:

$0.5 < d_{I\text{-}II}/f < 2$;
$0.05 < f_I/f < 0.4$; and
$0.8 < f_{II}/f < 3$.

16. The exposure apparatus of claim 15, wherein said small-diameter lens group include first, second and third lens groups whose respective refractive powers are positive, negative and positive, said first, second and third lens groups being arranged in an order from a side of said liquid-crystal light valve.

17. The exposure apparatus of claim 16, wherein said first, second and third lens groups, having respective focal lengths of $f_{I1}$, $F_{I2}$ and $F_{I3}$ satisfy the following inequalities:

$0.5 < |f_{I1}/f_{I2}| < 1.5$; and $1.4 < |f_{I3}/f_{I2}| < 2.5$

18. The exposure apparatus of claim 17, wherein said first and third lens groups of said small-diameter lens group include at least two positive lenses, and said second lens group of said small-diameter lens group includes a first pair of positive and negative bonded meniscus lenses in an order from a side of said liquid-crystal light valve, said first pair of meniscus lenses having a negative refractive power and having a convex side directed towards said liquid-crystal light valve, a single lens whose focal length is $f_{I22}$, and a second pair of negative and positive bonded meniscus lenses in an order from a side of said liquid-crystal light valve, said second pair of meniscus lenses having a negative refractive power and having a convex side directed towards said subject.

19. The exposure apparatus of claim 18, wherein the following inequalities are satisfied:

$0.5 < |f_{I22}/f_I| < 4$; and $15 < \gamma_{I2+} - \gamma_{I2-}$, where $\gamma_{I2+}$ and $\gamma_{I2-}$ are values of $\gamma_{436}$ of the respective positive and negative lenses in said second group, which is defined by the following equation on the basis of a refractive index $n\lambda$ at a wavelength $\lambda$:

$\gamma_{436} = (n_{436} - 1)/(n_{416} - n_{456})$.

20. An optical projection system, comprising:
a liquid-crystal light valve;
a light source;
a first optical means arranged between said light source and said liquid-crystal light valve for transmitting a first luminous flux that is emitted from said light source, through a liquid crystal layer of said liquid-crystal light valve that is formed into a predetermined pattern; and
second optical means arranged between said liquid-crystal light valve and a subject for bringing a luminous flux transmitted through said liquid crystal layer to a substantially telecentric second luminous flux and for illuminating said subject with said second luminous flux, whereby said subject is exposed to an optical image that corresponds to said predetermined pattern formed in said liquid crystal layer, wherein said second optical means includes a magnifying lens system that comprises a small-diameter lens group having a positive refractive power as a whole and a large-diameter convex lens having one side that is flat and which is directed towards said subject, said large-diameter convex lens being arranged between said small-diameter lens group and said subject, a focal length f of the entire magnifying lens system, a focal length $f_I$ of said small-diameter lens group, a focal length $f_{II}$ of said large-diameter convex lens and a distance $d_{I\text{-}II}$ between said small-diameter lens group and said large-diameter convex lens satisfies the following inequalities:

$0.5 < d_{I\text{-}II}/f < 2$;
$0.05 < f_I/f < 0.4$; and
$0.8 < f_{II}/f < 3$.

21. A lens system comprising:
a small-diameter lenses group including a plurality of lens, having a positive refractive power as a whole; and
a large-diameter convex lens, arranged to be located between said small-diameter lens group and a subject, having one side that is flat and which is directed toward the subject; and wherein
a focal length f os the entire lens system, a focal length $f_I$ of said small lens group, a focal length $f_{II}$ of said large-diameter convex lens and a distance $d_{I\text{-}II}$ between said small-diameter lens group and said large-diameter convex lens satisfies the following inequalities:

$0.5 < d_{I\text{-}II}/f < 2$;
$0.05 < f_I/f < 0.4$; and
$0.8 < f_{II}/f < 3$.

22. The lens system according to claim 21, wherein said small diameter lens group includes first, second and third lens groups whose respective refractive powers are positive, negative and positive, said first, second and third lens groups being arranged in an order from a side of said liquid-crystal light valve.

23. The lens system according to claim 22, wherein said first, second and third lens groups, having respective focal lengths of $f_{I1}$, $F_{I2}$ and $F_{I3}$ satisfy the following inequalities:

$0.5i < |f_{I1}/f_{I2}| < 1.5$; and $1.4 < |f_{I3}/f_{I2}| < 2.5$.

24. The lens system according to claim 23, wherein said first and third lens groups of said small diameter lens group include at least two positive lenses, and said second lens group of said small diameter lens group includes a first pair of positive and negative bonded meniscus lenses in an order from a side of said liquid crystal light valve, said first pair of meniscus lenses having a negative refracting power and having a convex side directed towards said liquid crystal light valve, a single lens whose focal length is $f_{I11}$, and a second pair of negative and positive bonded meniscus lenses in an order from a side of said liquid crystal light valve, said second pair of meniscus lenses having a negative refractive power and having a convex side directed toward said subject.

25. The lens system according to claim 24, wherein the following inequalities are satisfied:

$$0.5 < |f_{I22}/f_I| < 4; \text{ and}$$

$$15 < \gamma_{I2+} - \gamma_{I2-},$$

where $\gamma_{I2+}$ and $\gamma_{I2-}$ are values of $\gamma_{436}$ of the respective positive and negative lenses in said second group, which is defined by the following equation on the basis of a refractive index $n\lambda$ at a wavelength $\lambda$;

$$\gamma_{436} = (n_{436} - 1)/(n_{416} - n_{456}).$$

26. The lens system according to claim 21, wherein said large diameter convex lens is a plano-convex lens.

27. The lens system according to claim 21, wherein said convex lens is positioned adjacent the subject.

* * * * *

UNITED STATES PATENT AND TRADEMARK OFFICE
CERTIFICATE OF CORRECTION

PATENT NO. : 5,078,474

DATED : January 7, 1992

INVENTOR(S) : Masatoshi MARUI et al.

It is certified that error appears in the above-indentified patent and that said Letters Patent is hereby corrected as shown below:

On the cover, Item: [73], Assignee, line 1, change "Asaki" to ---Asahi---.

On the cover, Item: [56], References Cited, line 33, change "vol. 5, No. May 1975" to ---Vol. No. 5 May 1975---.

At column 16, line 61 (claim 1, line 22), change "powr" to ---power---.

At column 17, line 3 (claim 1, line 32), change "large-daimeter" to ---large-diameter---.

At column 18, line 3 (claim 4, line 19), after "a" delete "group of".

At column 18, line 4 (claim 4, line 20), change "powr" to ---power---.

At column 18, line 8 (claim 4, line 24), after "said" delete "group of".

At column 18, line 9 (claim 4, line 25), change "an" to ---and---.

UNITED STATES PATENT AND TRADEMARK OFFICE
CERTIFICATE OF CORRECTION

PATENT NO. : 5,078,474
DATED : November 21, 1990
INVENTOR(S) : Masatoshi MARUI et al.

It is certified that error appears in the above-indentified patent and that said Letters Patent is hereby corrected as shown below:

At column 18, line 9 (claim 4, line 25), after "subject," delete "and".

At column 19, line 44 (claim 10, line 3), change "being" to ---having---.

At column 21, line 8 (claim 15, line 21), change "$d_{III}$" to ---$d_{I-II}$---.

At column 22, line 26 (claim 21, line 2), change "lenses" to ---lens---.

At column 22, line 27 (claim 21, line 3), change "lens" to ---lenses---.

At column 22, line 33 (claim 21, line 9), change "os" to ---of---.

At column 22, line 55 (claim 23, line 5), change "$0.5i<|f_{I1}/f_{I2}|<1.5$; and" to ---$0.5<|f_{I1}/f_{I2}|<1.5$; and---.

At column 22, line 68 (claim 24, line 10), change "$f_{I11}$" to

UNITED STATES PATENT AND TRADEMARK OFFICE
CERTIFICATE OF CORRECTION

PATENT NO. : 5,078,474
DATED : November 21, 1990
INVENTOR(S) : Masatoshi MARUI et al.

It is certified that error appears in the above-indentified patent and that said Letters Patent is hereby corrected as shown below:

---$f_{122}$---.

Signed and Sealed this

Twenty-first Day of November, 1995

Attest:

BRUCE LEHMAN

Attesting Officer      Commissioner of Patents and Trademarks